(12) United States Patent
Momose

(10) Patent No.: US 8,377,389 B2
(45) Date of Patent: Feb. 19, 2013

(54) MICROFLUIDIC CIRCUIT

(75) Inventor: Shun Momose, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 643 days.

(21) Appl. No.: 11/748,140

(22) Filed: May 14, 2007

(65) Prior Publication Data

US 2007/0277927 A1    Dec. 6, 2007

(30) Foreign Application Priority Data

May 16, 2006    (JP) .................. 2006-136783

(51) Int. Cl.
- *B01L 3/00* (2006.01)
- *G01N 21/00* (2006.01)

(52) U.S. Cl. .............. 422/503; 422/502; 422/82.05; 436/180

(58) Field of Classification Search .......... 422/100, 422/500–504; 385/4, 14, 122, 129; 436/180
See application file for complete search history.

(56) References Cited

U.S. PATENT DOCUMENTS

| | | | | |
|---|---|---|---|---|
| 6,498,353 B2 * | 12/2002 | Nagle et al. | ......... | 250/573 |
| 6,698,454 B2 * | 3/2004 | Sjolander et al. | ......... | 137/885 |
| 7,446,462 B2 * | 11/2008 | Lim et al. | ......... | 313/112 |
| 2005/0260828 A1 | 11/2005 | Yuasa | | |
| 2010/0208328 A1 * | 8/2010 | Heikenfeld et al. | ......... | 359/290 |

FOREIGN PATENT DOCUMENTS

| | | |
|---|---|---|
| JP | 2000-218698 | 8/2000 |
| JP | 2000-353687 | 12/2000 |
| JP | 2001-191412 | 7/2001 |
| JP | 2003-302359 | 10/2003 |
| JP | 2004-235465 | 8/2004 |
| JP | 2004-340702 | 12/2004 |
| JP | 2005-074796 | 3/2005 |
| JP | 2005-119050 | 5/2005 |
| JP | 2007-040751 | 2/2007 |
| WO | 99/44217 | 9/1999 |

OTHER PUBLICATIONS

"All electronic appliance and machinery companies compete for the biochip market," Nikkei Biobusiness , pp. 42-43, (2003).

* cited by examiner

Primary Examiner — Dean Kwak
(74) Attorney, Agent, or Firm — Fish & Richardson P.C.

(57) ABSTRACT

A fabrication method of a microfluidic circuit is provided, dispensable of mask registration, absent of deviation in mask positioning, and inexpensive in fabrication cost. The fabrication method of a microfluidic circuit has a light transmissive substrate stacked on a light absorptive substrate, and the light transmissive substrate welded with the light absorptive substrate for bonding by directing light through the light transmissive substrate. The microfluidic circuit includes a microchannel at the bottom face of the light transmissive substrate and/or at the top face of the light absorptive substrate. The method includes the step of forming, at the light transmissive substrate, a light attenuation region attenuating transmittance of light towards the microchannel when light is directed through the light transmissive substrate.

4 Claims, 8 Drawing Sheets

MICROFLUIDIC CIRCUIT

BACKGROUND OF THE INVENTION

1. Field of the Invention

The present invention relates to a fabrication method of a microfluidic circuit employed in biochemical tests such as of DNA, protein, cells, blood, or the like. The present invention also relates to a microfluidic circuit effective for use in μTAS (Micro Total Analysis System) employed in chemical synthesis, environment analysis, or the like.

2. Description of the Related Art

A microfluidic circuit allows a series of experimental operations carried out in a laboratory to be implemented in a chip that is approximately 2 cm square and 2 mm in thickness. The microfluidic circuit provides various advantages such as: only a small amount of samples and reagents is required; costs are low; reaction speed is fast; high-throughput tests can be performed; and results can be obtained immediately at the site where the sample was taken.

A plan view of an exemplary microfluidic circuit is shown in FIG. 1. This circuit is directed to a hepatic function test. Referring to FIG. 1, approximately 10 μL of blood is introduced into the circuit through a sample injection inlet 1. The blood is separated into blood cells and blood plasma by centrifugation. Only the blood plasma is delivered to a blood plasma retaining chamber 2. In a weighing chamber 3, the amount of blood plasma is measured, and the blood plasma is transferred to a blending chamber 7. Then, the reagent stored in a reagent retaining chamber 4 is blended. After the blood plasma and the reagent are mixed in a mixing chamber 5, examination of the hepatic function is conducted at a measuring chamber 6. The measurement is carried out by directing a laser beam of short wavelength and detecting the light absorption with a photodiode. In this manner, a series of operations from the preprocessing of the sampled blood to the aforementioned measurement can be carried out within the microfluidic circuit to effect tests on various items such as γ-GTP, AST (GOT), ALT (GPT), lactate dehydrogenase (LDH), and the like (refer to "All electronic appliance and machinery companies compete for the biochip market", Nikkei Biobusiness, December 2003, pp. 42-43).

A fabrication method of a conventional microfluidic circuit is shown in FIGS. 4A-4K. In accordance with this method, the microchannel (flow channel), the reagent retaining chamber and the like of the microfluidic circuit are formed by microfabrication techniques based on the combination of photolithography, etching, and molding. First, a silicon substrate 41 is heated under an oxygen ambient to form an $SiO_2$ film 42 on silicon substrate 41 (FIG. 4A). Then, a resist 43 is formed on $SiO_2$ film 42 (FIG. 4B). For the resist, resist containing polymethacrylic acid ester such as polymethyl methacrylate (PMMA) as the main component, or a chemical amplification resist having sensitivity to ultraviolet (UV), is employed.

Then, a mask 44 is arranged on resist 43, and UV 45 is directed through mask 44 (FIG. 4C). Mask 44 is constituted of an UV absorption layer 44b formed in accordance with the arrangement and shape of the microchannel, the reagent retaining chamber and the like in the microfluidic circuit to be fabricated, and a translucent base 44a. Quartz glass or the like is employed for translucent base 44a. Chromium or the like is employed for absorption layer 44b. In the case where a positive resist is employed, irradiation of UV 45 causes resist 43b alone to be exposed and changed in property by the function of absorption layer 44b. Resist 43b is removed by development to leave resist 43a (FIG. 4D). In contrast, when a negative resist is employed, the exposed portion is left and the non-exposed portion is removed. Therefore, a mask pattern of a version opposite to that of a positive resist is employed.

Next, plasma etching or wet etching is effected using resist 43a as a mask (FIG. 4E), and then resist 43a is removed (FIG. 4F). A metal film is formed by vapor deposition or the like on the obtained $SiO_2$ film 42a (FIG. 4G). Silicon substrate 41 and $SiO_2$ film 42a are removed by wet etching or mechanical peeling to result in a mold 46 (FIG. 4H). Then, injection molding or the like with molten plastic is conducted using mold 46 (FIG. 4I) to fabricate a light transmissive substrate 47a (FIG. 4J). Polyethylene terephthalate, for example, is used for the plastic. Finally, light transmissive substrate 47a is bonded with a corresponding light absorptive substrate 47b. Thus, a microfluidic circuit 47 including a microchannel can be obtained (FIG. 4K) (refer to the aforementioned "All electronic appliance and machinery companies compete for the biochip market", Nikkei Biobusiness, December 2003, pp. 42-43).

The method of bonding light transmissive substrate 47a with corresponding light absorptive substrate 47b includes heat fusion through thermal pressing or ultrasonic waves, a method employing an adhesive, or the like. The heat fusion method is disadvantageous in that the microchannel will be readily deformed by excessive heat, and that the bioactive substance fixed may be adversely affected to cause functional inhibition. The method using an adhesive is disadvantageous in that the excessive adhesive material may ooze into the microchannel to block the microchannel or contaminate the inner wall.

There is known a laser bonding method as an improvement of the disadvantages set forth above, as disclosed in Japanese Patent Laying-Open Nos. 2005-074796 and 2000-218698. A conventional laser bonding method is shown in FIG. 2. A laser beam 22 output from a laser light source 21 is arranged to enter a contact face 26 of light transmissive substrate 24 and light absorptive substrate 25 perpendicularly. Light transmissive substrate 24 is formed of a material that allows transmittance of laser beam 22. Light absorptive substrate 25 is formed of a material that absorbs laser beam 22. By directing a laser beam 22 with laser light source 21 moved in the direction of the arrow, contact face 26 of light transmissive substrate 24 and light absorptive substrate 25 is fused by the exposed light and then cooled for bonding. Since a microchannel (not shown) is formed at the bottom of light transmissive substrate 24, irradiation of the microchannel with laser beam 22 during the fusion step, as for contact face 26, will cause the microchannel to be heated and deformed. Therefore, mask 23 is employed to prevent the microchannel from being irradiated with the laser beam.

This method of blocking light using a mask is disadvantageous in that a relevant mask must be provided, and an extra step of registration between the mask and the microchannel is required. The fabrication efficiency of microfluidic circuits is reduced to become a factor of increasing the cost. There is also a problem that the positioning between the mask and microchannel is readily deviated. Such deviation in positioning may cause heat deformation at the microchannel, leading to nonuniform bonding. This may become the cause of liquid leakage. It is therefore difficult to obtain an accurate measurement.

SUMMARY OF THE INVENTION

In view of the foregoing, an object of the present invention is to provide a fabrication method of a microfluidic circuit and a microfluidic circuit fabricated by such a method, dispensable of mask registration, absent of deviation in mask positioning, and inexpensive in fabrication cost.

According to an aspect of the present invention, a fabrication method of a microfluidic circuit has a light transmissive substrate stacked on a light absorptive substrate, and the light transmissive substrate welded with the light absorptive substrate for bonding by directing light through the light transmissive substrate. The microfluidic circuit includes a microchannel at a bottom face of the light transmissive substrate and/or at a top face of the light absorptive substrate. The method includes the step of forming, at the light transmissive substrate, a light attenuation region attenuating transmittance of light towards the microchannel when light is directed through the light transmissive substrate.

According to another aspect of the present invention, a microfluidic circuit includes a light absorptive substrate, and a light transmissive substrate on the light absorptive substrate. The microfluidic circuit also includes a microchannel at a bottom face of the light transmissive substrate and/or at a top face of the light absorptive substrate. The light transmissive substrate includes a light attenuation region for reducing transmittance of light towards the microchannel when light is directed through the light transmissive substrate.

Since a mask for blocking light is not used, it is not necessary to additionally provide a mask. Mask positioning is dispensable, and deviation in mask positioning is eliminated. Therefore, the fabrication cost can be reduced. A microfluidic circuit of high accuracy can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
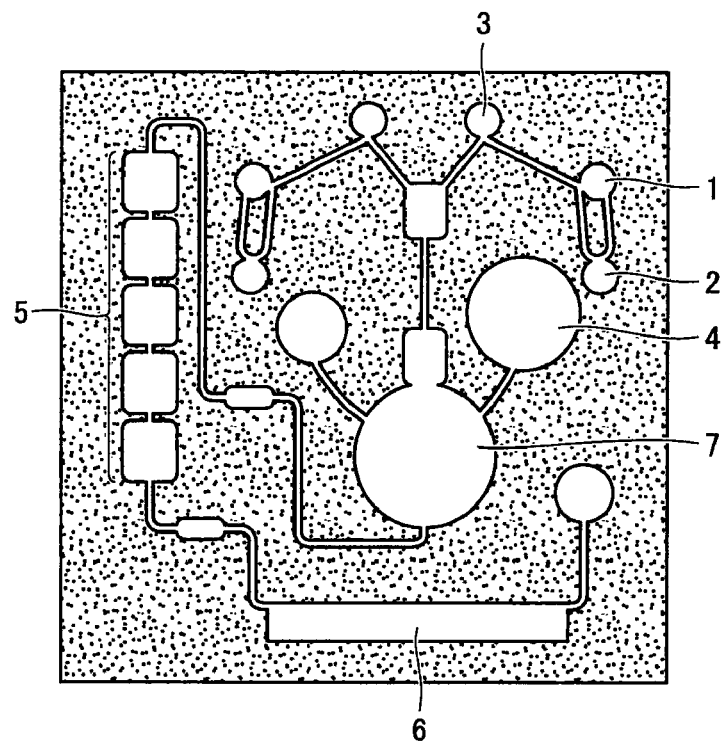
FIG. 1 is a plan view of a conventional microfluidic circuit.
Figure 2:
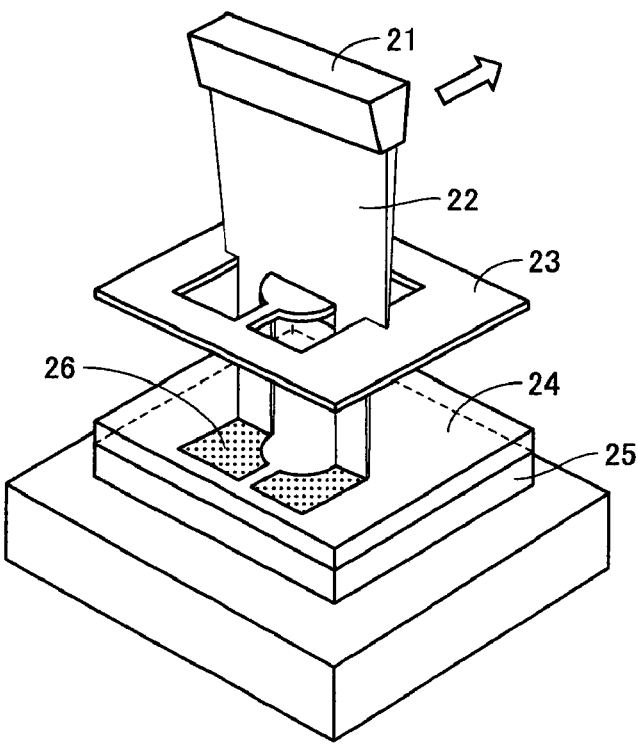
FIG. 2 is a perspective view corresponding to a conventional laser bonding method.
Figure 3A:
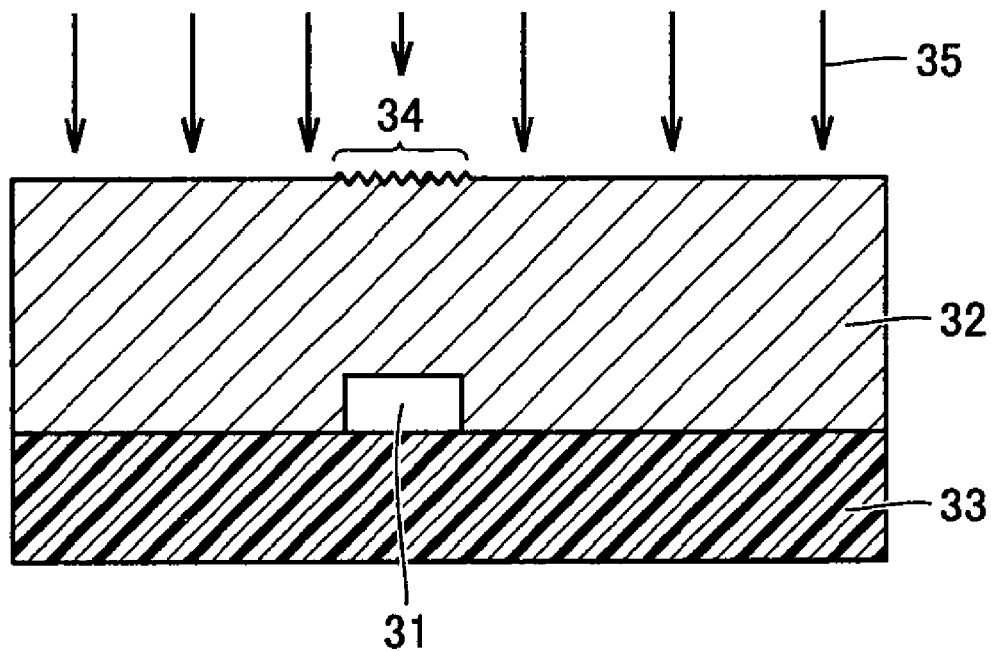
FIGS. 3A and 3B are sectional views of a configuration of a microfluidic circuit of the present invention.
Figure 3B:
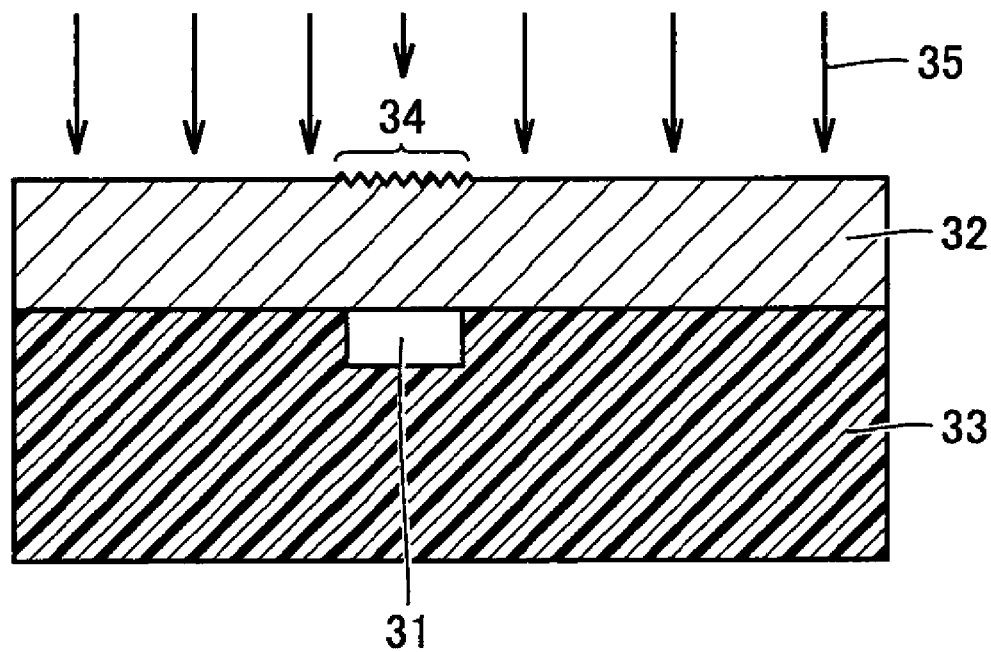
Figure 4A:
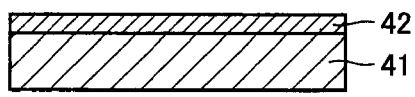
FIGS. 4A-4K represent steps of a fabrication method of a conventional microfluidic circuit.
Figure 4B:
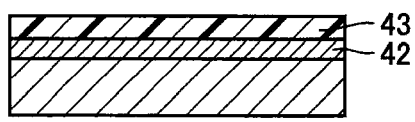
Figure 4C:
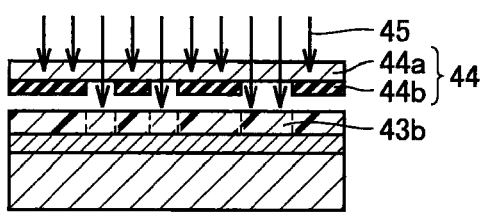
Figure 4D:
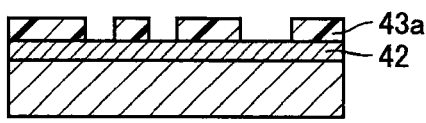
Figure 4E:
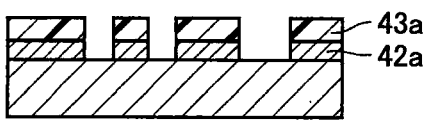
Figure 4F:
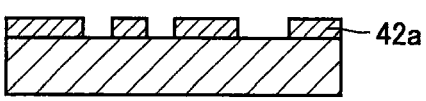
Figure 4G:
Figure 4H:
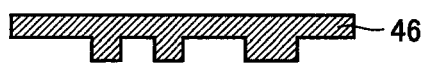
Figure 4I:
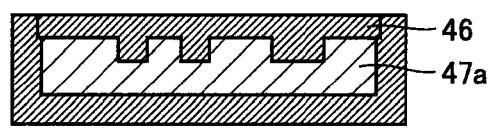
Figure 4J:
Figure 4K:
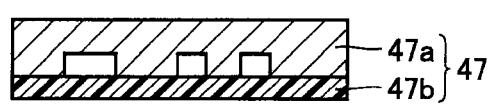

Referring to FIGS. 3A and 3B, a microfluidic circuit of the present invention includes a light transmissive substrate 32, and a light absorptive substrate 33 bonded at the bottom face of light transmissive substrate 32, and a microchannel 31 at the bottom face of light transmissive substrate 32 and/or at the top face of light absorptive substrate 33. Light transmissive substrate 32 includes a light attenuation region 34. When light such as a laser beam 35 is directed through light transmissive substrate 32, the transmittance of light towards microchannel 31 is attenuated by light attenuation region 34. Since the light attenuation region formed at the light transmissive substrate functions as a conventional mask, it is not necessary to additionally provide a mask. The light attenuation region can be formed at the same time as the substrate by injection molding or the like. Thus, the fabrication cost can be reduced.

FIG. 3A represents an example of microchannel 31 provided at the bottom face of light transmissive substrate 32. FIG. 3B represents an example of microchannel 31 provided at the top face of light absorptive substrate 33. In the example of FIG. 3A, the microchannel and the light attenuation region are provided integrally, dispensable of conventional mask registration. Therefore, the fabrication step can be simplified. Further, by virtue of the integral provision of the microchannel and light attenuation region, deviation in positioning between the microchannel and the light attenuation region will not occur. It is therefore possible to attenuate only the transmissive light towards the microchannel. Deformation of the microchannel caused by heat can be prevented, ensuring the bonding between the light transmissive substrate and the light absorptive substrate at the contact face. Accordingly, liquid leakage can be prevented. Thus, a microfluidic circuit of high accuracy can be provided.

Similarly in the example of FIG. 3B, a mask that was conventionally indispensable is not required. Therefore, the fabrication cost can be reduced. The registration step between the mask and microchannel can be omitted. Furthermore, an embodiment of a microfluidic circuit including a microchannel at both the bottom face of the light transmissive substrate and at the top face of the light absorptive substrate, depending upon the required product specification, can be implemented. The present invention includes such an embodiment. The present invention will be described hereinafter based on the example of FIG. 3A.

The microfluidic circuit of the present invention can be fabricated by stacking a light transmissive substrate on a light absorptive substrate, and welding the light transmissive substrate with the light absorptive substrate for bonding by directing light through the light transmissive substrate. The light attenuation region at the light transmissive substrate can be formed by injection molding or the like. For the purpose of preventing heat deformation of the microchannel to provide a microfluidic circuit of high accuracy, the amount of transmitted light at the microchannel is attenuated preferably to not more than 80%, further preferably to not more than 60% and particularly preferably to not more than 50% of the amount of directed light towards the light transmissive substrate by virtue of the light attenuation region. Attenuation of the amount of light transmitted to the microchannel can be implemented by adjusting the surface roughness of the light attenuation region, forming a cavity having a face to which the directed light does not enter perpendicularly, incorporating a light blocking material or the like.

Example 1

Figure 5A:
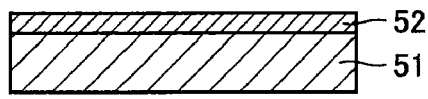
FIGS. 5A-5K represent steps of a fabrication method of a microfluidic circuit according to the present invention.
Figure 5B:
Figure 5C:
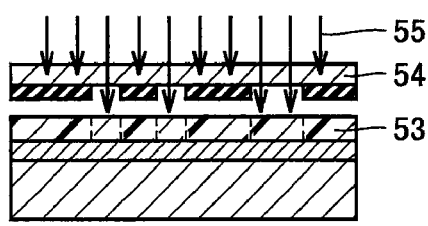
Figure 5D:
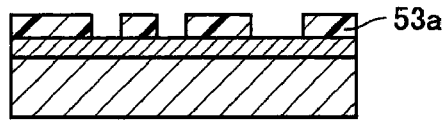
Figure 5E:
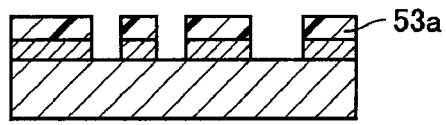
Figure 5F:
Figure 5G:
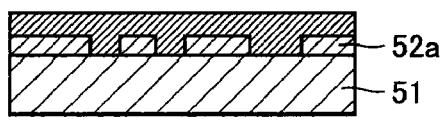
Figure 5H:
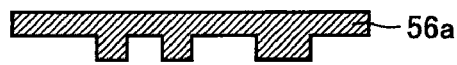
Figure 5I:
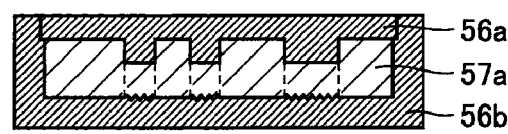

In the present example, attention is focused on the relationship between the surface roughness of the light attenuation region at the light transmissive substrate and the amount of transmitted light at the microchannel. A fabrication method of a microfluidic circuit of the present invention is shown in FIGS. 5A-5K. First, an $SiO_2$ film 52 was formed on a silicon substrate 51 (FIG. 5A). A resist 53 was formed on $SiO_2$ film 52 (FIG. 5B). Polymethyl methacrylate (PMMA) was employed as the resist. Then, a mask 54 was arranged on resist 53. UV 55 was directed via mask 54 (FIG. 5C), and development was carried out (FIG. 5D). Next, plasma etching was performed (FIG. 5E), followed by removal of resist 53a (FIG. 5F). Then, a metal film was formed by vapor deposition (FIG. 5G). Next, silicon substrate 51 and $SiO_2$ film 52a were removed by wet etching to result in a mold 56a (FIG. 5H).

Figure 5J:
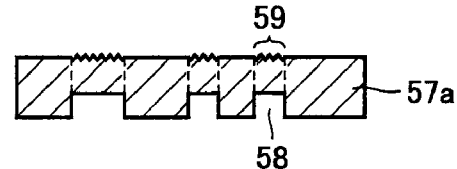

Then, a mold 56b qualified as the counterpart of mold 56a was subjected to blasting. The arithmetical mean roughness Ra of the face in contact with the light attenuation region was adjusted to 1 μm to 50 μm. Subsequently, injection molding with molten polyethylene terephthalate (PET) liquid was conducted (FIG. 5I) to obtain a light transmissive substrate 57a including, at the top face, a light attenuation region 59 having an arithmetical mean roughness Ra of 1 μm-50 μm, and at the bottom face, a microchannel 58 of approximately 200 μm in width and 200 μm in depth (FIG. 5J). Light transmissive substrate 57a was approximately 7 mm in thickness. The surface of light transmissive substrate 57a, excluding the light attenuation region, had an arithmetical mean roughness Ra of less than 1 μm. The arithmetical mean roughness Ra was measured based on JIS-B0601 and JIS-B0651, using, for example, VL2000D available from Lasertec Corporation. With regards to the resin for injection molding, thermoplastic resin such as polymethyl methacrylate (PMMA), polycarbonate (PC), polypropylene (PP), polystyrene (PS), polyvinyl chloride (PVC), cycloolefin polymer (COP), and the like can be used, in addition to PET. For example, Dianite MA 521 available from Mitsubishi Rayon Co., Ltd. can be used as the PET. Specifically, Dianite MA 521 was subjected to drying by a hot air drying machine at 150° C. for 5 hours to 10 hours to have moisture removed, and then used for injection molding at the molding temperature of 275° C. under the resin pressure of 15 kg/cm$^2$. As an alternative to the injection molding, an imprint process or the like can be employed for the fabrication of a substrate.

Then, a laser beam was directed through light transmissive substrate 57a from a direction perpendicular thereto. Measurement was conducted to identify how much the amount of transmitted light at microchannel 58 is attenuated by light attenuation region 59. The laser beam had a wavelength of 940 nm (infrared) and output power of 30 W, scanned at 10 mm/s. The amount of directed light and the amount of transmitted light at the microchannel were measured using a photodiode (PD). The measurement results indicated that, due to random reflection at light attenuation region 59, the transmittance at the microchannel became 80% or below when arithmetical mean roughness Ra of the light attenuation region was 5 μm to 50 μm, and became 50% or below when arithmetical mean roughness Ra was 5 μm to 50 μm, of the amount of directed light towards the light transmissive substrate. Therefore, the arithmetical mean roughness Ra is preferably 1 μm to 50 μm, more preferably 5 μm to 50 μm.

Figure 5K:
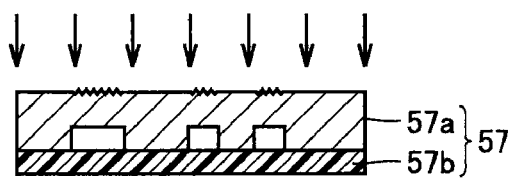

Finally, injection molding was conducted using PET containing 5 mass % of carbon black having the grain size of 30 nm-50 nm to produce a light absorptive substrate 57b with a laser beam transmittance of 0%. Preferably, the thickness of the light absorptive substrate is approximately 0.5 mm. Then, a light transmissive substrate 57a was stacked on light absorptive substrate 57b. A laser beam was directed through light transmissive substrate 57a perpendicular thereto, whereby light transmissive substrate 57a and light absorptive substrate 57b were welded for bonding. Thus, a microfluidic circuit 57 was obtained (FIG. 5K). Microfluidic circuit 57 is absent of heat deformation at the microchannel, and corresponds to a microfluidic circuit of high accuracy, having the light transmissive substrate bonded with the light absorptive substrate at the contact face. Although a laser bonding method was employed in the present example, a lamp welding method or the like can also be employed.

Example 2

Figure 6:
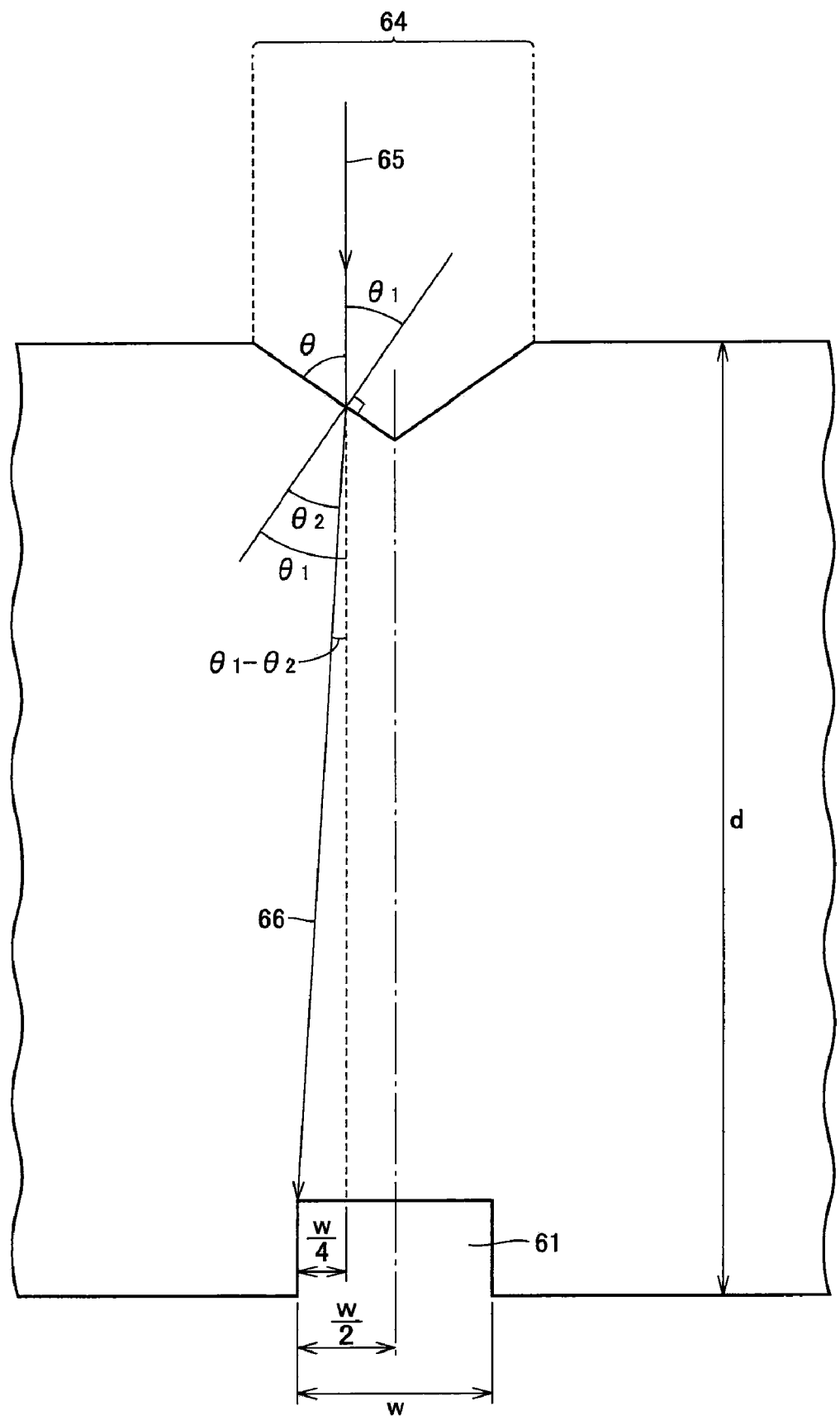
FIGS. 6, 7 and 8 are sectional views of a light transmissive substrate according to second, third, and fourth embodiments, respectively.

In the present example, attention is directed to a light attenuation region that has a cavity with a triangular cross section as an example of the light attenuation region having a face to which the directed light does not enter perpendicularly at the light transmissive substrate. Likewise Example 1, mold 56a was fabricated (FIG. 5H). Then, injection molding was carried out in a manner similar to that of Example 1, employing a mold having a profile such that the cross section of the light attenuation region at the light transmissive substrate corresponds to a triangle, as the counterpart to mold 56a. FIG. 6 is a sectional view of the obtained light transmissive substrate. This light transmissive substrate had a thickness d and a refraction index n. The light transmissive substrate includes a light attenuation region 64 at the top face and a microchannel 61 having a width w at the bottom face.

Referring to FIG. 6, directed light beam 65 enters light attenuation region 64 to be refracted at the slope of light attenuation region 64. Refracted light 66 arrives at an end of microchannel 61. Directed light beam 65 enters light attenuation region 64 at an angle θ with respect to the slope of light attenuation region 64 ($\theta_1=90-\theta$), and is refracted at an angle $\theta_2$. Consider the case where the amount of transmitted light at microchannel 61 is attenuated to 50% of the amount of directed light towards the light transmissive substrate by the function of light attenuation region 64. Among the light applied to the width w/2 of microchannel 61, the light applied to (w/2)×(1.00−0.50)=w/4 does not arrive at microchannel 61, so that:

$$\tan(\theta_1-\theta_2)\approx(w/4)/d=w/4d.$$

Let $\sin\theta_1/\sin\theta_2=n/1$ by the Snell's law, then:

$$\tan[\theta_1-\sin^{-1}\{(\sin\theta_1)/n\}]=w/4d, \text{ based on the two equations.}$$

By $\theta_1=90-\theta$, $$\tan[90-\theta-\sin^{-1}\{(\sin(90-\theta))/n\}]\geq w/4d \text{ is established.}$$

When $(d/w)\tan[90-\theta-\sin^{-1}\{(\sin(90-\theta))/n\}]\geq 0.25$, the amount of transmitted light at microchannel 61 is attenuated to 50% or below of the amount of directed light to the light transmissive substrate by the function of light attenuation region 64. Therefore, by virtue of the light attenuation region of the light transmissive substrate including a cavity having a face to which the directed light does not enter perpendicularly, the amount of transmitted light to the microchannel can be attenuated by the light attenuation region.

Similarly, consider the case where the amount of transmitted light at the microchannel is attenuated to 80% of the amount of directed light towards the light transmissive substrate by means of the light attenuation region. Among the light directed to the width w/2 of the microchannel, the light applied to (w/2)×(1.00−0.80)=w/10 does not arrive at the microchannel, so that:

$$\tan(\theta_1-\theta_2)\approx(w/10)/d=w/10d.$$

Then, $\tan[\theta_1-\sin^{-1}\{(\sin\theta_1)/n\}]=w/10d.$ $\tan[90-\theta-\sin^{-1}\{(\sin(90-\theta))/n\}]\geq w/10d$ is established.

When $(d/w)\tan[90-\theta-\sin^{-1}\{(\sin(90-\theta))/n\}]\geq 0.1$, the amount of transmitted light at the microchannel is attenuated to 80% or below of the amount of directed light to the light transmissive substrate.

Assuming that $(d/w)\tan[90-\theta-\sin^{-1}\{(\sin(90-\theta))/n\}]=A$, the value of A is preferably at least 0.1 and at least 0.25 for the attenuation of the amount of transmitted light to the microchannel to not more than 80% and not more than 50%, respectively, caused by the light attenuation region, by virtue of the light attenuation region at the light transmissive substrate including a cavity having a face to which the directed light does not enter perpendicularly.

Finally, likewise Example 1, a light absorptive substrate was produced by injection molding. The light transmissive substrate was stacked on the light absorptive substrate, and a laser beam was applied through the light transmissive substrate in a manner perpendicular to the light transmissive substrate for bonding of the light transmissive substrate and the light absorptive substrate. Thus, a microfluidic circuit was obtained. This microfluidic circuit is absent of heat deformation in the microchannel. Thus, a microfluidic circuit of high accuracy, having the light transmissive substrate bonded with the light absorptive substrate uniformly, can be provided.

Example 3

Figure 7:
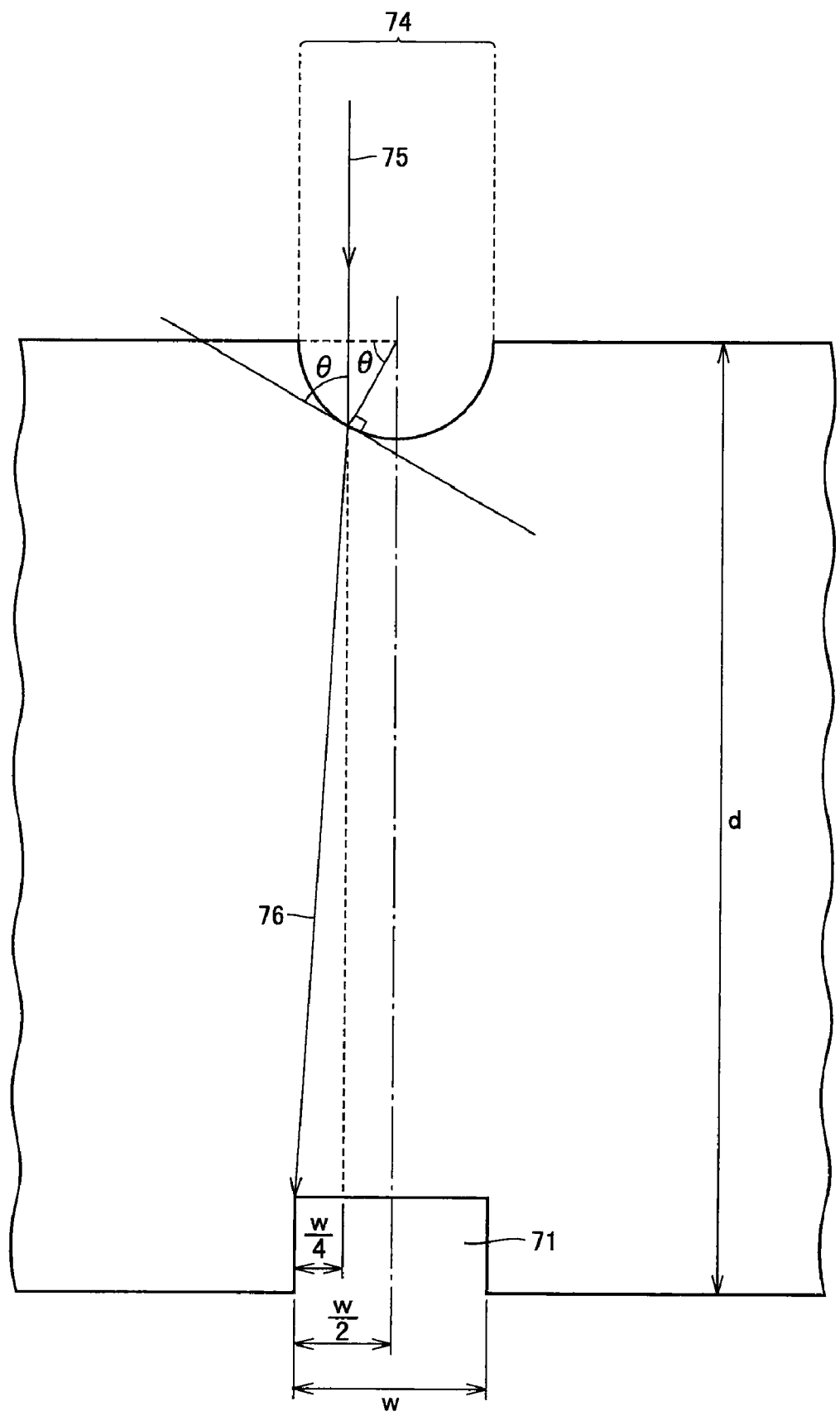

In the present example, attention is directed to a light attenuation region that has a cavity with a semicircle cross section as an example of the light attenuation region having a face to which the directed light does not enter perpendicularly at the light transmissive substrate. Likewise Example 1, mold 56a was fabricated (FIG. 5H). Then, injection molding was carried out in a manner similar to that of Example 1, employing a mold having a profile such that the cross section of the light attenuation region at the light transmissive substrate corresponds to a semicircle, as the counterpart to mold 56a. FIG. 7 is a sectional view of the obtained light transmissive substrate. Referring to FIG. 7, this light transmissive substrate had a thickness d and a refraction index n. The light transmissive substrate includes a light attenuation region 74 at the top face and a microchannel 71 having a width w at the bottom face.

In FIG. 7, directed light beam 75 enters light attenuation region 74 at an angle θ to be refracted at the slope of light attenuation region 74. Refracted light 76 arrives at an end of microchannel 71. Consider the case where the amount of transmitted light at microchannel 71 is attenuated to 50% or below of the amount of directed light towards the light transmissive substrate, by light attenuation region 74. Likewise Example 2, $\tan[90-\theta-\sin^{-1}\{(\sin(90-\theta))/n\}] \geq w/4d$ is established, and $(d/w)\tan[90-\theta-\sin^{-1}\{(\sin(90-\theta))/n\}] \geq 0.25$.

For example, when the diameter of the semicircle formed at the light attenuation region is equal to width w of microchannel 71, θ=60°, so that when:

$(d/w)\tan\{30-\sin^{-1}(\frac{1}{2}n)\} \geq 0.25$, the amount of transmitted light at microchannel 71 is attenuated to 50% or below of the amount of directed light to the light transmissive substrate by virtue of light attenuation region 74.

Similarly, consider the case where the amount of transmitted light towards the microchannel is to be attenuated to 80% or below of the amount of directed light to the light transmissive substrate by the light attenuation region. The condition is: $(d/w)\tan[90-\theta-\sin^{-1}\{(\sin(90-\theta))/n\}] \geq 0.1$, likewise Example 2.

For example, when the diameter of the semicircle formed at the light attenuation region is equal to width w of microchannel 71, θ=37° by cos θ=80/100. Therefore, when $(d/w)\tan\{53-\sin^{-1}(\frac{4}{5}n)\} \geq 0.1$, the amount of transmitted light at microchannel 71 is attenuated to 50% or below of the amount of directed light to the light transmissive substrate by virtue of light attenuation region 74.

Assuming that $(d/w)\tan[90-\theta-\sin^{-1}\{(\sin(90-\theta))/n\}]=A$, the value of A is preferably at least 0.1 and at least 0.25 for the attenuation of the amount of transmitted light to the microchannel to 80% or below and 50% or below, respectively, caused by the light attenuation region, by virtue of the light attenuation region at the light transmissive substrate including a cavity having a face to which the directed light does not enter perpendicularly.

Finally, likewise Example 1, a light absorptive substrate was produced by injection molding. The light transmissive substrate was stacked on the light absorptive substrate, and a laser beam was applied through the light transmissive substrate in a manner perpendicular to the light transmissive substrate for bonding of the light transmissive substrate and the light absorptive substrate. Thus, a microfluidic circuit was obtained. This microfluidic circuit is absent of heat deformation in the microchannel. Thus, a microfluidic circuit of high accuracy, having the light transmissive substrate bonded with the light absorptive substrate uniformly, can be provided.

Example 4

Figure 8:
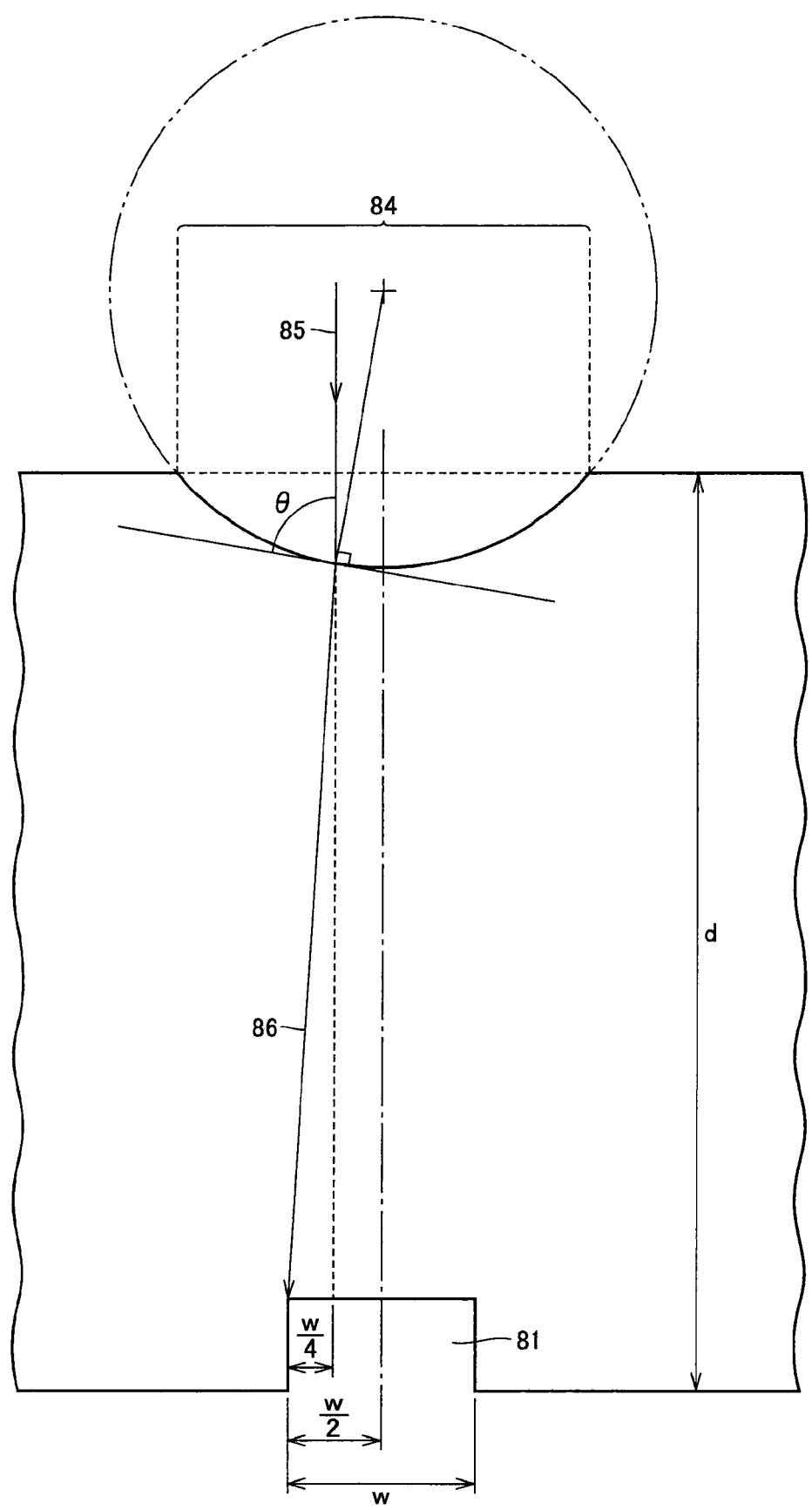

In the present example, attention is directed to a light attenuation region that has a cavity with an arc cross section as an example of the light attenuation region having a face to which the directed light does not enter perpendicularly at the light transmissive substrate. Likewise Example 1, mold 56a was fabricated (FIG. 5H). Then, injection molding was carried out in a manner similar to that of Example 1, employing a mold having a profile such that the cross section of the light attenuation region at the light transmissive substrate corresponds to an arc, as the counterpart to mold 56a. FIG. 8 is a sectional view of the obtained light transmissive substrate. Referring to FIG. 8, this light transmissive substrate had a thickness d and a refraction index n. The light transmissive substrate includes a light attenuation region 84 at the top face and a microchannel 81 having a width w at the bottom face.

In FIG. 8, directed light beam 85 enters light attenuation region 84 at an angle θ to be refracted at the slope. Refracted light 86 arrives at an end of microchannel 81. Consider the case where the amount of transmitted light at microchannel 81 is to be attenuated to 50% or below of the amount of directed light towards the light transmissive substrate, by light attenuation region 84. Likewise Example 2, $\tan[90-\theta-\sin^{-1}\{(\sin(90-\theta))/n\}] \geq w/4d$ is established, and $(d/w)\tan[90-\theta-\sin^{-1}\{(\sin(90-\theta))/n\}] \geq 0.25$.

Similarly, consider the case where the amount of transmitted light towards the microchannel is to be attenuated to 80% or below of the amount of directed light to the light transmissive substrate by the light attenuation region. The condition is:

$(d/w)\tan[90-\theta-\sin^{-1}\{(\sin(90-\theta))/n\}] \geq 0.1$, likewise Example 2.

Assuming that $(d/w)\tan[90-\theta-\sin^{-1}\{(\sin(90-\theta))/n\}]=A$, the value of A is preferably at least 0.1 and at least 0.25 for the attenuation of the amount of transmitted light to the microchannel to 80% or below and 50% or below, respectively, caused by the light attenuation region, by virtue of the light attenuation region at the light transmissive substrate including a cavity having a face to which the directed light does not enter perpendicularly.

Finally, likewise Example 1, a light absorptive substrate was produced by injection molding. The light transmissive substrate was stacked on the light absorptive substrate, and a laser beam was applied through the light transmissive substrate in a manner perpendicular to the light transmissive substrate for bonding of the light transmissive substrate and the light absorptive substrate. Thus, a microfluidic circuit was obtained. This microfluidic circuit is absent of heat deformation in the microchannel. Thus, a microfluidic circuit of high accuracy, having the light transmissive substrate bonded with the light absorptive substrate uniformly, can be provided.

Example 5

Figure 9A:
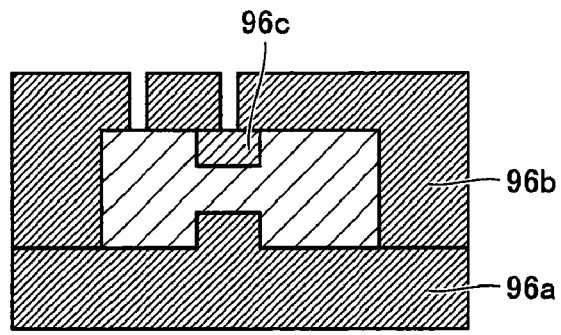
FIGS. 9A-9D represent steps of a fabrication method of a light transmissive substrate according to a fifth embodiment.
Figure 9B:
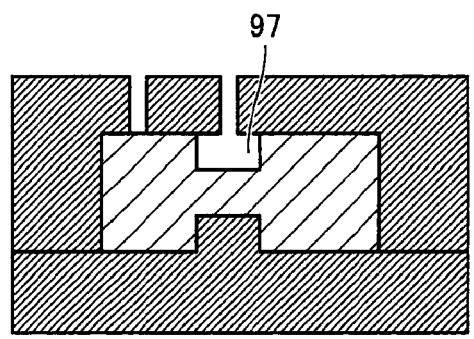
Figure 9C:
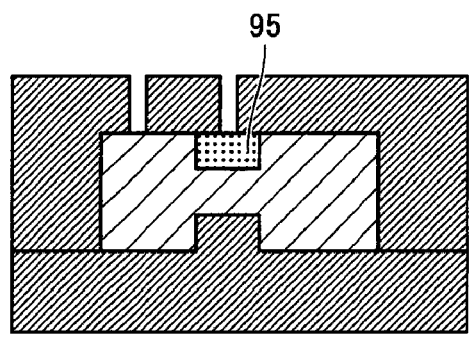
Figure 9D:
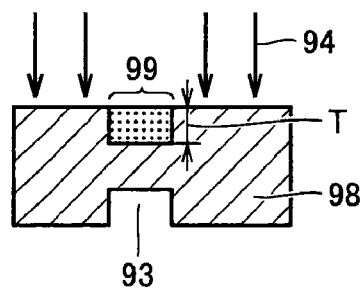

The present example is directed to the case where the light attenuation region at the light transmissive substrate contains a light blocking material. Such a light transmissive substrate was fabricated according to a method shown in FIGS. 9A-9D. First, a mold 96a, as shown in FIG. 9A, was fabricated in a manner similar to that of Example 1. Then, mold 96a was combined with a corresponding mold 96b, and subjected to injection molding in a manner similar to that of Example 1. The mold includes an internal movable mold 96c. Referring to FIG. 9B, movable mold 96c was moved after injection molding to form a void 97. Then, resin material 95 containing a light blocking material such as carbon black was injected into void 97, as shown in FIG. 9C. By such double molding, a light transmissive substrate 98, as shown in FIG. 9D, was obtained. Since light attenuation region 99 at light transmissive substrate 98 contains a light blocking material, the amount of transmitted light towards microchannel 93 can be attenuated when a laser beam 94 or the like is directed thereto. For example, by forming the light attenuation region with resin material 95 containing 5 mass % of carbon black having the grain size of 30 nm-50 nm such that the thickness T is 100 µm, the amount of transmitted light at microchannel 93 can be attenuated to 0%.

Finally, likewise Example 1, a light absorptive substrate was produced by injection molding. The light transmissive substrate was stacked on the light absorptive substrate, and a laser beam was applied through the light transmissive substrate in a manner perpendicular to the light transmissive substrate for bonding of the light transmissive substrate and the light absorptive substrate. Thus, a microfluidic circuit was obtained. This microfluidic circuit is absent of heat deformation in the microchannel. Thus, a microfluidic circuit of high accuracy, having the light transmissive substrate bonded with the light absorptive substrate uniformly, can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A microfluidic circuit comprising:
   a light, absorptive substrate,
   a light transmissive substrate stacked on said light absorptive substrate, wherein said light transmissive substrate has a thickness d and a refraction index n, and
   a microchannel at a bottom face of said light transmissive substrate, wherein the microchannel has a width w, and wherein a value of $(d/w)\tan[90-\theta-\sin^{-1}\{(\sin(90-\theta))/n\}]$ is at least 0.1, where $\theta$ is an incident angle of directed light transmitted to said microchannel,
   wherein the light transmissive substrate is welded with the light absorptive substrate for bonding by directing light through the light transmissive substrate,
   wherein said light transmissive substrate includes a light attenuation region that includes a cavity having a face that is not perpendicular to the directed light and the attenuates an amount of transmitted light to said microchannel by random reflection when light is directed through said light transmissive substrate,
   wherein the light attenuation region at the light transmissive substrate contains a light blocking material composed of carbon black, and
   wherein the microchannel does not have heat deformation.

2. The microfluidic circuit according to claim 1, wherein the amount of transmitted light at said microchannel is attenuated, by said light attenuation region, to not more than 80% of an amount of directed light to said light transmissive substrate.

3. The microfluidic circuit according to claim 1, wherein said light attenuation region at said light transmissive substrate includes a surface having an arithmetical mean roughness Ra of 1 µm to 50 µm.

4. The microfluid circuit according to claim 1, wherein the light transmissive substrate is composed of thermoplastic resin.

* * * * *